(12) United States Patent
Schofield et al.

(10) Patent No.: US 7,602,169 B1
(45) Date of Patent: Oct. 13, 2009

(54) INPUT CANCELLATION CIRCUIT

(75) Inventors: William George John Schofield, North Andover, MA (US); Lawrence A. Singer, Wenham, MA (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 12/108,873

(22) Filed: Apr. 24, 2008

(51) Int. Cl.
 *G01R 1/20* (2006.01)

(52) U.S. Cl. .................... 324/126; 324/110; 326/21

(58) Field of Classification Search ................. 324/110, 324/126, 600, 609; 326/20–25
See application file for complete search history.

(56) References Cited

U.S. PATENT DOCUMENTS

| | | | | |
|---|---|---|---|---|
| 3,243,740 A | * | 3/1966 | Sziklai | 333/214 |
| 3,665,476 A | * | 5/1972 | Taylor | 343/701 |
| 6,985,035 B1 | * | 1/2006 | Khorramabadi | 330/253 |

* cited by examiner

*Primary Examiner*—Don P Le
(74) *Attorney, Agent, or Firm*—Kenyon & Kenyon LLP

(57) ABSTRACT

A system and method are provided for isolating an input without adding significant distortion and without significantly adversely affecting the bandwidth of input circuits. In one embodiment, a single ended signal is substantially cancelled by an arrangement including an input resistance path in parallel with a negative resistance path wherein both paths substantially match in resistance. In another embodiment, a differential signal is substantially cancelled by a pseudo differential arrangement including two independent input resistance paths each in parallel with a corresponding negative resistance path, wherein the resistance paths substantially match the input resistance paths. In yet another embodiment, a differential signal is substantially cancelled by a differential arrangement including two resistance paths wherein a first negative resistance path is coupled between the first differential input and the second differential output and the second negative resistance path is coupled between the second input and the first output. In yet another embodiment, a current controlled current source may provide the negative amplification for the negative resistance path.

27 Claims, 4 Drawing Sheets

INPUT CANCELLATION CIRCUIT

COPYRIGHT AND LEGAL NOTICES

A portion of the disclosure of this patent document contains material which is subject to copyright protection. The copyright owner has no objection to the facsimile reproduction by anyone of the patent document or the patent disclosure, as it appears in the Patent and Trademark Office patent files or records, but otherwise reserves all copyrights whatsoever.

BACKGROUND INFORMATION

The present invention relates in general to input cancellation circuits, and more particularly to input cancellation in resistively coupled circuits.

Low noise resistively coupled circuits may need a small input resistor to ensure that the noise contribution of the input resistor does not dominate the overall noise of the system. The system may need to be isolated, for example, for calibration purposes. To isolate the input, a series switch may be used. However, if the series switch resistance is allowed to dominate over the input resistor, it may result in significant distortion during normal operation due to non-linear junction capacitances. If the series switch resistance is made small with respect to the low input resistance, the large physical size of the switch can introduce significant parasitic capacitance and reduce the bandwidth of the input circuits. Furthermore, if the input is allowed to exceed the supply voltage by more than the gate oxide breakdown of the series switch, then when the series switch is isolated, the oxide of the switch may be exposed to damage.

For example, FIG. 1 shows an input cancellation circuit 100 in accordance with prior art. It comprises an input 110 for receiving an input signal from an external source, a series resistance 130 coupled to the input 110, a switch 140 which may be an NFET transistor, coupled to the series resistance 130, and an output 120 coupled to the output of the switch 140. The NFET used as a switch 140 can add substantial distortion during normal operation due to its non-linear junction capacitance. For a given channel length for the NFET 140, the "ON" resistance is a function of the width or size of the NFET 140. Thus, to reduce the "ON" resistance, the width of the NFET 140 needs be increased. However, as the size of the NFET 140 increases, the parasitic capacitance of the device increases with it, thereby reducing the bandwidth of the input circuits. Furthermore, if the input 110 is allowed to exceed the supply voltage by more than the gate oxide breakdown of the NFET 140, then when the NFET 140 is isolated, the oxide of the NFET may be exposed to damage.

Thus, there is a need for a system and method for isolating an input without adding significant distortion and without significantly adversely affecting the bandwidth of input circuits.

BRIEF DESCRIPTION OF THE DRAWINGS

The invention is illustrated in the figures of the accompanying drawings, which are meant to be exemplary and not limiting, and in which like references are intended to refer to like or corresponding parts.

DETAILED DESCRIPTION

Figure 1:
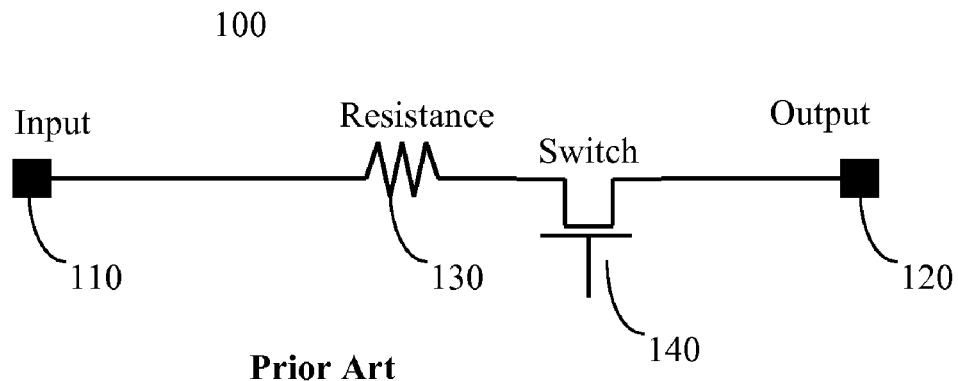
FIG. 1 shows an input isolation circuit as may be used in the prior art.
Figure 2:
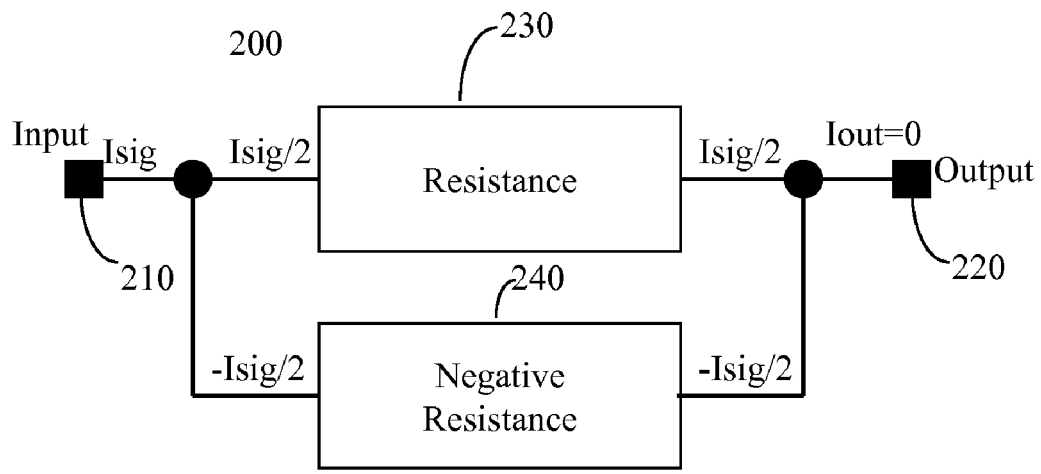
FIG. 2 shows a block diagram of a single ended isolation method in accordance with an embodiment of the invention.

A system and method is provided for effectively isolating an input from a circuit. FIG. 2 shows a block diagram of a single ended isolation method in accordance with an embodiment of the invention. An input 210 is coupled to an input resistance 230 and a negative resistance 240. The outputs of resistance 230 and negative resistance 240 are coupled to output 220. By making the negative resistance path 240 substantially equal in magnitude to the resistance 230, the signal at input 210 is effectively cancelled. For example, the current through resistance 230 Isig/2 and the current through the negative resistance 240 Isig/2 is equal but opposite in direction. Therefore, the current at the output 220 is 0, thereby effectively canceling the signal at input 210. These relationships are summarized by the following equations:

$$Iout = \frac{V_{Input} - V_{Output}}{R\|-R}$$

$$R\|-R = \frac{-R \times R}{R + (-R)}$$

If $|R| = |-R|$ then, $R\|-R = \infty$, and $Iout = 0$

Figure 4:
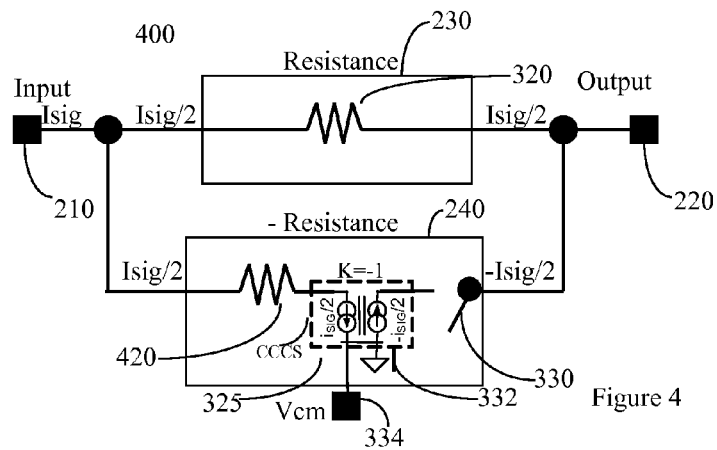
FIG. 4 shows a diagram of a single ended isolation method in accordance with an embodiment of the invention wherein the negative resistance path includes a resistance and a current controlled current source.

As illustrated in FIG. 4, the input resistance 230 may comprise a resistor 320. The negative resistance path 240 may comprise a current controlled current source (CCCS) 325 with a gain substantially equaling −1 and a resistor 420. In yet another embodiment, negative resistance path 240 may further comprise a switch 330. It is understood that the switch 330 may comprise bipolar or FET transistors. For example, in one embodiment the switch may be an NFET or a PFET. The switch 330 may be turned "OFF" during normal operation, thereby allowing signals to travel from the input 210 through the resistance 230 to the output 220. When the switch 330 is "ON," the resistance 420 should match resistance 320 and the gain of the CCCS should be substantially equal to −1. The closer the resistance of the resistance 420 matches input resistance 320 and the gain of the CCCS equals −1, the less cancellation current inaccuracies arise. In another embodiment, the gain of the CCCS 325 may be non-unity if the total resistance of the negative resistance path 240 is scaled up or down such that the current through 230 is equal in magnitude and opposite in direction to the current through the output terminal of 240, leading to output 220. For example, if the total resistance of resistor 420 is 2 times the resistance of resistor 320, then K may be scaled to −0.5 to compensate. The CCCS 325 may have a control 332 to isolate or enable the negative resistance path. Other terminals of the CCCS 325 include a first terminal leading to input 210, a second terminal leading to output 220, a third terminal connected to ground, and a fourth terminal connected to a control voltage 334 such that when the negative resistance 240 is enabled the voltage on output 220 is substantially equal to said control voltage 334. Control 332 may be used instead of switch 330 or in addition to switch 330.

Figure 3:
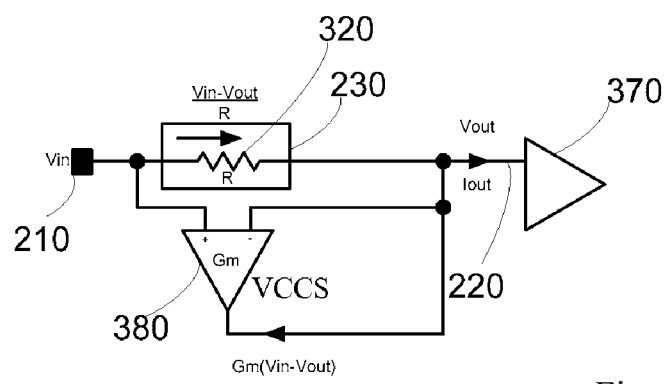
FIG. 3 shows a single ended input isolation circuit with a voltage controlled current source in accordance with an embodiment of the invention.

In an alternative embodiment, a voltage controlled current source (VCCS) may be used instead of a CCCS. For example, FIG. 3. shows a single ended input isolation circuit with a VCCS in accordance with an embodiment of the invention. The voltage across the input resistor R 320 is sensed by the VCCS 380. If Gm of the VCCS is 1/R, then the current at the node 220 will be 0. Driver 370 represents the load of the negative resistance circuit. The following relationships summarize the operation illustrated in FIG. 3:

$$Iout = \frac{Vin - Vout}{R} + Gm(Vout - Vin)$$

$$\text{if } Gm = \frac{1}{R} \text{ then } Iout = 0 \text{ as desired}$$

Figure 5:
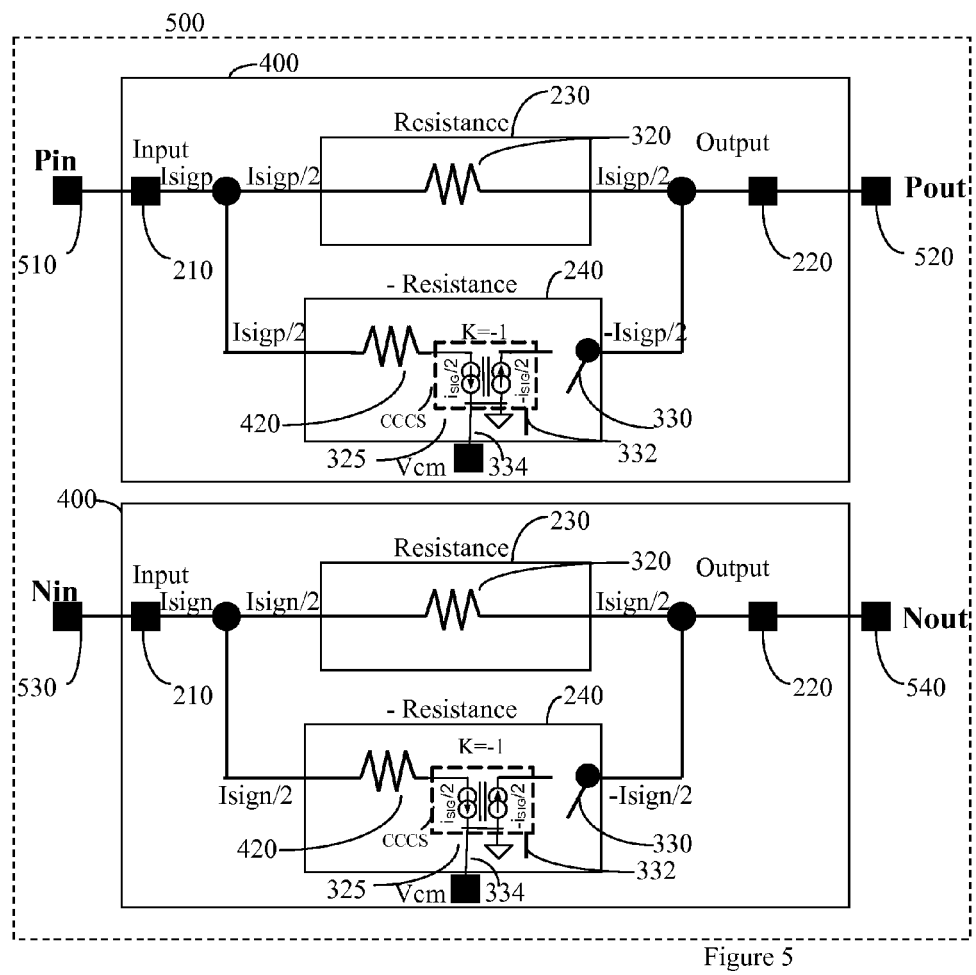
FIG. 5 shows a pseudo-differential input isolation circuit in accordance with an embodiment of the invention.

FIG. 5 shows a pseudo-differential input isolation circuit in accordance with an embodiment of the invention. It may comprise two systems 200, 300, or 400. For example, in the pseudo differential circuit 500, the top and bottom paths each comprise system 400. The positive input 510 is coupled to the input of the top system 400. Positive output 520 is coupled to the output of the top system 400. Similarly, negative input 530 is coupled to the input of the bottom system 400 and negative output 540 is coupled to the output of the bottom system 400. The arrangement in 500 accommodates differential signals wherein each end of the differential signal is cancelled singleendedly. The positive input of the differential signal may be applied to input 510 and the negative input to input 530. During normal operation, switches 330, if present, may be turned "OFF," thereby allowing the differential signal to travel from inputs 510 and 530 to outputs 520 and 540 accordingly. When the switches 330 are turned "ON," as explained, for example, in the description of system 400 of FIG. 4, each end of the differential signal is cancelled, thereby canceling the differential signal. Instead of the switches 330 or in addition to, control signal 332 may isolate or enable the negative resistance paths.

Figure 6:
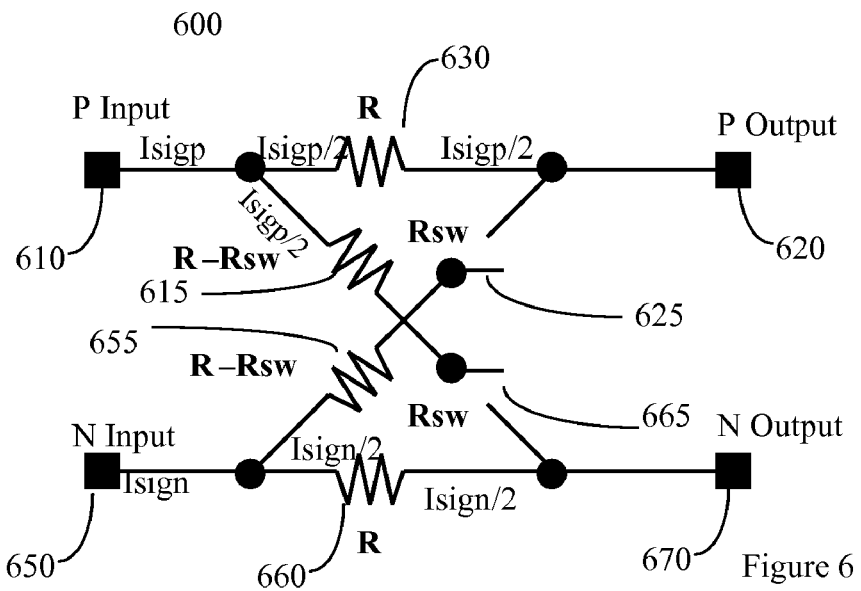
FIG. 6 shows a differential input isolation circuit in accordance with an embodiment of the invention.

FIG. 6 shows a differential input isolation circuit in accordance with a preferred embodiment of the present invention. Differential inputs, wherein the positive input is applied to input 610 and the negative input is applied to input 650, are isolated by effectively canceling the differential input signal. Resistance 630 is coupled between the positive input 610 and the positive output 620. This may represent the first input resistance path. Resistance 660 is coupled between negative input 650 and negative output 670. This represents the second input resistance path. The path between the positive input 610 and the negative output 670 represents the first negative resistance path. Similarly, the path between the negative input 650 and the positive output 620 represents the second negative resistance path. The total resistance of the first negative resistance path is configured to substantially match the resistance of the first input resistance path. Similarly, the total resistance of the second negative resistance path is configured to substantially match the resistance of the second input resistance path. The closer the negative resistance path matches the input resistance path, the less cancellation current inaccuracies arise, leaving just common mode currents at the positive output 620 and negative output 670 accordingly. The first negative resistance path may comprise different components. For example, it may comprise a resistor 615. Further, the first negative resistance path may comprise a switch 665 instead of resistor 615 or in addition to resistance 615. Regardless of the number or type of components in the first negative resistance path, the magnitude of the resistance of the first negative resistance path should substantially match the first input resistance path.

The aforementioned description of the relationship between the first negative resistance path and the first input resistance path also applies to the relationship between the second negative resistance path and the second input resistance path. Thus, the second negative resistance path may comprise a resistor 655. Further, the second negative resistance path may comprise a switch 625 instead of resistor 655 or in addition to resistor 655. As in the first negative resistance path, the magnitude of the resistance of the second negative resistance path should substantially match the second input resistance path.

In a configuration where switches are included, as illustrated in the exemplary embodiment of FIG. 6, switches 625 and 665 may be turned "OFF" during normal operation, thereby allowing signals to travel from the differential inputs 610 and 650 to the outputs 620 and 670 accordingly. Thus, the first side of the differential signal may travel from the input 610 through input resistance 630 to output 620. Similarly, the second side of the differential signal may travel from the input 650 through input resistance 660 to output 670. In one embodiment, switches 625 and 665 may be NFETs or PFETs.

As explained in the discussion above, the closer the negative resistance path matches the input resistance path, the better signal cancellation is achieved. When the negative resistance path includes a switch, for example an NFET or PFET, it must be configured such that the total of the "ON" resistance of the switch in addition to any other elements in the negative resistance path substantially match that of the input resistance path.

Figure 8:
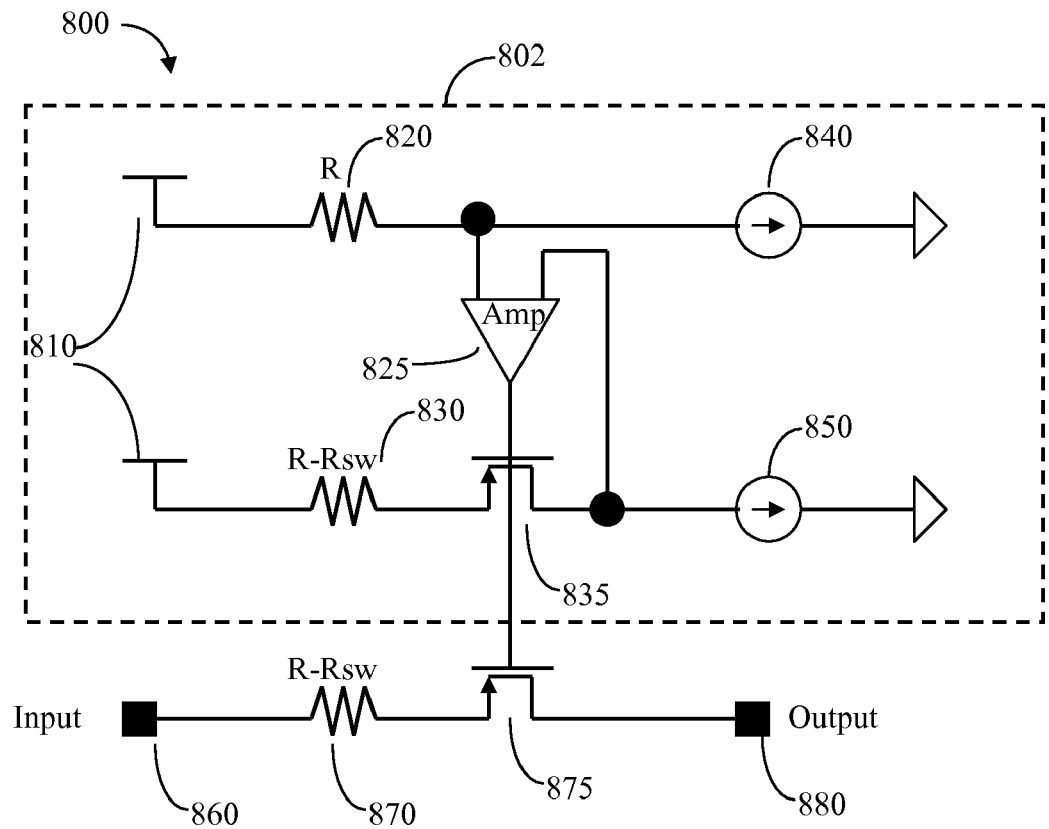
FIG. 8 shows a switch biasing means in accordance with an embodiment of the invention.

FIG. 8 illustrates an exemplary circuit which allows the resistance of the negative resistance path to substantially match that of the input resistance path. Input 860 coupled to resistor 870 which is connected in series to PFET 875 coupled to output 880, represents a negative resistance path. The components within the dotted rectangle 802 are part of a dummy circuit which biases the gate of PFET 875 such that the negative resistance path substantially matches the input resistance path. Amplifier 825 senses the voltage at the output of resistor 820, which represents an input resistance. Input resistance 820 is biased by current source 840. The combination of the resistor 830 in series with the PFET 835 represents the negative resistance path. Since the voltage at the two inputs of an amplifier 825 are substantially similar, the output of the PFET 835 is forced to the same voltage as the output of input resistance 820. Thus, the feedback loop forces the gate voltage of the PFET 835 to a level which effectively forces the source to drain resistance of PFET 835 to be such that the total resistance of resistor 830 and the source to drain resistance of the PFET 835 substantially match the resistance of the input resistor 820. Now moving outside of the dummy cells of 802, since the same gate voltage that is applied to PFET 835 is applied to PFET 875 as well, the total resistance of input resistor 870 and the drain to source resistance of PFET 875 will substantially match the input resistance 820. The drain of PFET 875 and the drain of PFET 835 are substantially at the same voltage. Further, the Vdd 810 is the common mode voltage that is seen at input 860. This approach may further benefit from a common mode correction circuit which senses the output 880 and forces it to a common mode level by either sourcing or sinking current through the input resistor 870.

Figure 7:
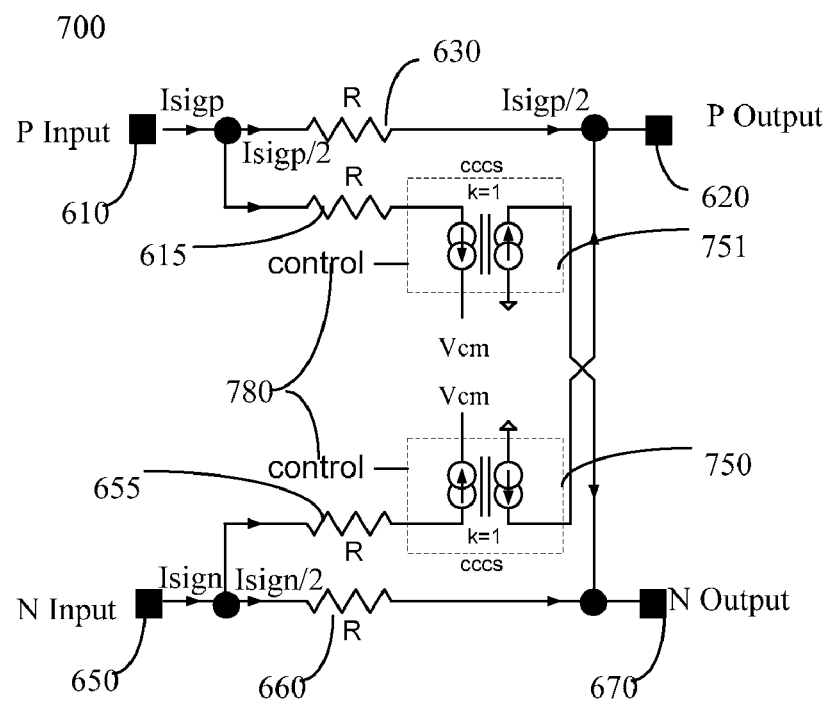
FIG. 7 shows a differential input isolation circuit with a current controlled current source in accordance with an embodiment of the invention.

FIG. 7 shows a differential input isolation circuit in accordance with a preferred embodiment of the invention. The system 700 may comprise elements similar to system 600 of FIG. 6 except that in system 700 the switches 625 and 665 are removed and system 700 further comprises a CCCS 750 and CCCS 751. One of the benefits of using CCCS 750 and CCCS 751 is that it may prevent potential damage to switches 625 and 665 as compared to the embodiment illustrated in FIG. 6. In one embodiment, switches 625 and 665 may be NFETs or, alternatively PFETs. For example, referring to FIG. 8 to illustrate, when PFET 875 is turned "OFF," the source of the PFET 875 tracks the input 860 which may go above the supply, thereby turning on the inherent parasitic source to bulk diode of the PFET 875, which is undesirable. If PFET 875 is replaced with an NFET and the NFET is turned "OFF," the drain to gate junction of the NFET may be exposed to the signal from input 860 which, depending on the sensitivity of the NFET and the magnitude of the input signal, may damage the junction. The use of CCCS 750 and 751, as illustrated in FIG. 7, does not need to rely on, for example, NFETs or PFETs to be used as switches, thereby further improving the reliability of the input cancellation circuit. There may be a control 780 to isolate or enable the cancellation of the signals at input 610 and input 650.

Figure 9:
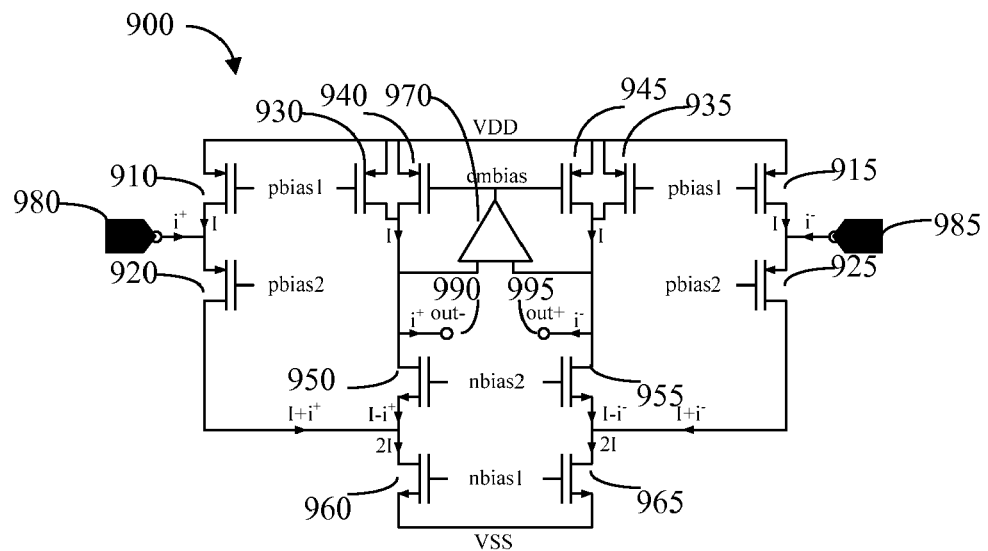
FIG. 9 shows an embodiment of a current controlled current source.

There are different ways that one skilled in the art may implement a CCCS. FIG. 9 shows an example of a CCCS as may be used in an embodiment of the input cancellation circuit. The CCCS circuit may comprise PFETs 910, 915, 920, 925, 930, 940 945, and 935, NFETs 950, 955, 960, and 965, and Op-Amp 970. The system 900 conveys substantially the same current to output 990 that it senses at input 980 when it is configured with unity gain. Similarly, the same current at output 995 is supplied that is sensed at input 985. The output currents at 990 and 995 are cross coupled to provide a differential sign inversion and hence a CCCS gain substantially equal to −1 and may also provide common mode correction. The CCCS 900 may, for example, replace the CCCS 750 and 751 of FIG. 7.

Although the present invention has been described with reference to particular examples and embodiments, it is understood that the present invention is not limited to those examples and embodiments. For example, ones skilled in the art may use bipolar devices instead of FETs. The present invention as claimed, therefore, includes variations from the specific examples and embodiments described herein, as will be apparent to one of skill in the art. Accordingly, it is intended that the invention be limited only in terms of the appended claims.

What is claimed is:

1. An input cancellation circuit comprising:
    an input for receiving an input signal from an external source and an output for providing an output signal;
    an input resistance path coupled between said input and said output; and
    a negative resistance path coupled in parallel to said input resistance path, wherein said negative resistance path substantially matches said input resistance path, where said input signal is substantially cancelled.
2. The input cancellation circuit of claim 1 wherein said negative resistance path includes an isolating element.
3. The input cancellation circuit of claim 2 wherein said isolating element is a PFET or NFET.
4. The input cancellation circuit of claim 2 wherein said isolating element is a bipolar transistor.
5. The input cancellation circuit of claim 2 wherein said negative resistance path further includes at least one resistor in series with said isolating element.
6. The input cancellation circuit of claim 1 wherein said negative resistance path includes a voltage controlled current source.
7. The input cancellation circuit of claim 1 wherein said negative resistance path includes at least one resistor.
8. The input cancellation circuit of claim 7 wherein said negative resistance path further includes a current controlled current source in series with said at least one resistor.
9. The input cancellation circuit of claim 8 wherein said current controlled current source has an adjustable gain to adjust said negative resistance path to substantially match said input resistance path.
10. A pseudo differential input cancellation circuit comprising:
    a first input for receiving a positive end of a differential signal from an external source and a first output for providing said positive end of said differential signal;
    a first input resistance path coupled between said first input and said first output; and
    a first negative resistance path coupled in parallel to said first input resistance path, wherein said first negative resistance path substantially matches said first input resistance path;
    a second input for receiving a negative end of said differential signal from said external source and a second output for providing said negative end of said differential signal;
    a second input resistance path coupled between said second input and said second output; and
    a second negative resistance path coupled in parallel to said second input resistance path, wherein said second negative resistance path substantially matches said second input resistance path; where said positive end of said differential signal and negative side of said differential signal are cancelled.
11. The pseudo differential input cancellation circuit of claim 10 wherein each of said first negative resistance path and said second negative resistance path include at least one isolating element.
12. The pseudo differential input cancellation circuit of claim 11 wherein said isolating element is a PFET or NFET.
13. The pseudo differential input cancellation circuit of claim 11 wherein said isolating element is a bipolar transistor.
14. The pseudo differential input cancellation circuit of claim 11 wherein both said first negative resistance path and said second negative resistance path further include at least one resistor in series with each said isolating element.
15. The pseudo differential input cancellation circuit of claim 10 wherein each of said first negative resistance path and said second negative resistance path include at least one voltage controlled current source.
16. The pseudo differential input cancellation circuit of claim 10 wherein each of said first negative resistance path and said second negative resistance path include at least one resistor each.
17. The pseudo differential input cancellation circuit of claim 16 wherein said first negative resistance path and said second negative resistance path further include a current controlled current source in series with said respective isolating element.

18. The pseudo differential input cancellation circuit of claim 17 wherein each said current controlled current source has an adjustable gain to adjust each said negative resistance path to substantially match said input resistance path.

19. A differential input cancellation circuit comprising:
- a first input for receiving a positive side of a differential signal from an external source and a first output for providing said positive side of said differential signal;
- a second input for receiving a negative side of said differential signal from said external source and a second output for providing said negative side of said differential signal;
- a first input resistance path coupled between said first input and said first output;
- a second input resistance path coupled between said second input and said second output;
- a first negative resistance path coupled between said first input and said second output; and
- a second negative resistance path coupled between said second input and said first output.

20. The differential input cancellation circuit of claim 19 wherein each of said first negative resistance path and said second negative resistance path include at least one isolating means.

21. The differential input cancellation circuit of claim 20 wherein said isolating element is a PFET or NFET.

22. The differential input cancellation circuit of claim 20 wherein said isolating element is a bipolar transistor.

23. The differential input cancellation circuit of claim 20 wherein both said first negative resistance path and said second negative resistance path further include at least one resistor in series with each said isolating element.

24. The differential input cancellation circuit of claim 19 wherein each of said first negative resistance path and said second negative resistance path include at least one voltage controlled current source.

25. The differential input cancellation circuit of claim 19 wherein each of said first negative resistance path and said second negative resistance path include at least one resistor each.

26. The differential input cancellation circuit of claim 25 wherein each of said first negative resistance path and said second negative resistance path further include a current controlled current source in series with said respective isolating element.

27. The differential input cancellation circuit of claim 26 wherein each said current controlled current source has an adjustable gain to adjust each said negative resistance path to substantially match said input resistance path.

* * * * *